(12) United States Patent
Takahashi

(10) Patent No.: US 9,437,721 B2
(45) Date of Patent: Sep. 6, 2016

(54) REVERSE-CONDUCTING IGBT WITH BUFFER LAYER AND SEPARATION LAYER FOR REDUCING SNAPBACK

(71) Applicant: Mitsubishi Electric Corporation, Tokyo (JP)

(72) Inventor: Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/964,772

(22) Filed: Dec. 10, 2015

(65) Prior Publication Data

US 2016/0093725 A1 Mar. 31, 2016

Related U.S. Application Data

(62) Division of application No. 14/465,224, filed on Aug. 21, 2014, now Pat. No. 9,257,543.

(30) Foreign Application Priority Data

Nov. 26, 2013 (JP) .................................. 2013-243938

(51) Int. Cl.
*H01L 27/08* (2006.01)
*H01L 29/08* (2006.01)
*H01L 29/10* (2006.01)
*H01L 29/739* (2006.01)
(Continued)

(52) U.S. Cl.
CPC ....... *H01L 29/7397* (2013.01); *H01L 27/0635* (2013.01); *H01L 28/20* (2013.01); *H01L 29/0649* (2013.01); *H01L 29/0804* (2013.01); *H01L 29/0821* (2013.01); *H01L 29/0834* (2013.01); *H01L 29/1004* (2013.01); *H01L 29/1095* (2013.01); *H01L 29/41708* (2013.01); *H01L 29/66348* (2013.01)

(58) Field of Classification Search
CPC ........... H01L 27/0802; H01L 27/0823; H01L 29/0804; H01L 29/0821; H01L 29/0838; H01L 29/1004; H01L 29/66348; H01L 29/7397
See application file for complete search history.

(56) References Cited

U.S. PATENT DOCUMENTS

2005/0045960 A1    3/2005   Takahashi
2005/0258493 A1   11/2005   Aono et al.
(Continued)

FOREIGN PATENT DOCUMENTS

JP    H05-275688 A    10/1993
JP    2005-101514 A    4/2005
(Continued)

OTHER PUBLICATIONS

Hideki Takahashi et al.; "1200V Reverse Conducting IGBT"; Proceedings of 2004 ISPSD; pp. 133-136.
(Continued)

*Primary Examiner* — Thanh V Pham
(74) *Attorney, Agent, or Firm* — Studebaker & Brackett PC

(57) ABSTRACT

In the reverse-conducting IGBT according to the present invention, an n-type buffer layer surrounds a p-type collector layer. A p-type separation layer surrounds an n-type cathode layer. The n-type buffer layer separates the p-type collector layer and the p-type separation layer from each other. The p-type separation layer separates the n-type cathode layer and the n-type buffer layer from each other. Therefore, the present invention makes it possible to reduce snapback.

10 Claims, 16 Drawing Sheets

(51) Int. Cl.
*H01L 29/66* (2006.01)
*H01L 27/06* (2006.01)
*H01L 49/02* (2006.01)
*H01L 29/06* (2006.01)
*H01L 29/417* (2006.01)

(56) References Cited

U.S. PATENT DOCUMENTS

| | | |
|---|---|---|
| 2007/0108468 A1 | 5/2007 | Takahashi |
| 2008/0048295 A1 | 2/2008 | Takahashi |
| 2008/0093697 A1 | 4/2008 | Kaneda et al. |
| 2008/0102576 A1 | 5/2008 | Suzuki et al. |
| 2010/0156506 A1 | 6/2010 | Tsuzuki et al. |

FOREIGN PATENT DOCUMENTS

| | | |
|---|---|---|
| JP | 2005-317751 A | 11/2005 |
| JP | 2007-134625 A | 5/2007 |
| JP | 2008-053648 A | 3/2008 |
| JP | 2008-103590 A | 5/2008 |
| JP | 2008-109028 A | 5/2008 |
| JP | 2010-171385 A | 8/2010 |
| JP | 2012-114321 A | 6/2012 |

OTHER PUBLICATIONS

Dinesh Kumar et al.; "RC-TCIGBT: A Reverse Conducting Trench Clustered IGBT"; Proceedings of the 19th ISPSD, 2007; pp. 161-164.

M. Rahimo et al.; "The Bi-mode Insulated Gate Transistor (BIGT) A Potential Technology for Higher Power Applications"; Proceedings of the 21st ISPSD, 2009; pp. 283-286.

REVERSE-CONDUCTING IGBT WITH BUFFER LAYER AND SEPARATION LAYER FOR REDUCING SNAPBACK

BACKGROUND OF THE INVENTION

1. Field of the Invention

The present invention relates to a reverse-conducting IGBT (RC-IGBT: Reverse-Conducting Insulated Gate Bipolar Transistor) forming characteristics of an IGBT and a diode with one structure, and in particular to a semiconductor device which can reduce snapback.

2. Background Art

In general, power devices have various demands such as voltage withstanding capacity, guarantee of a safety operation region for preventing an element from being destroyed during operation and the like, and one of the most important demands is low loss. Low loss of the power device has effects such as size reduction, weight reduction and the like of the device and leads to consideration to global environments through reduction of energy consumption in a broader meaning. Moreover, realization of these characteristics with a cost as low as possible is in demand. As one of means for solving this problem, a reverse-conducting IGBT forming characteristics of an IGBT and a diode with one structure is proposed.

The reverse-conducting IGBT is illustrated in p. 133 to 136, ISPSD2004. In a normal IGBT, only a $p^+$-type collector layer is formed on a back surface, but in the reverse-conducting IGBT, a $p^+$-type collector layer and an $n^+$-type cathode layer is formed on a back surface. Ideally, the reverse-conducting IGBT can obtain two effects of an IGBT and a diode with one structure.

This reverse-conducting IGBT has some technical problems. One of them is snapback while conducting. In order to maintain a low forward voltage, it is necessary that a p-n junction formed of the $p^+$-type collector layer and an $n^-$-type drift layer is forward-biased and a positive hole is injected from the $p^+$-type collector layer. However, due to the presence of the $n^+$-type cathode layer, an electron current flowing from an emitter electrode flows to the $n^+$-type cathode layer, and there is a problem that, until this junction is turned on, snapback occurs, while conductivity modulation does not occur, and an on voltage becomes high. A problem of the same nature also occurs during an FWD operation with a flow in an opposite direction. If a gate voltage becomes positive, and an n-channel MOSFET channel enters an accumulated state, the electron current flows to the channel side, and a similar snapback phenomenon occurs, which incurs an increase in loss.

In response to these problems, a structure in which a locally wide $p^+$-type collector layer is made and an IGBT operation portion, first, is formed is illustrated in p. 283 to 286, ISPSD2009. Moreover, a structure in which an $n^+$-type cathode layer is surrounded by a p-type separation layer, and an oxide film is embedded in a boundary with a back electrode is illustrated in p. 161 to 164, ISPSD2007. Both have an effect of suppressing snapback in an operation direction of an IGBT. However, the former has a problem of an increase in a chip area, and the latter has a problem of a rise of heat resistance of the back electrode and the like.

Another problem of the reverse-conducting IGBT is an increase of a recovery current during the FWD operation. In the reverse-conducting IGBT, there is a relationship of trade-off in a part of the characteristics of the IGBT operation and the FWD operation, respectively. Thus, when balance is considered, it is difficult to lower the recovery current. In order to solve this problem, there are methods of substantially lowering concentration of a p-type base layer, of macro arrangement of the IGBT/FWD, of local lifetime control and the like (see Japanese Patent Laid-Open No. 2005-101514, Japanese Patent Laid-Open No. 2005-317751, Japanese Patent Laid-Open No. 2007-134625, and Japanese Patent Laid-Open No. 2008-053648, for example). However, there is a problem of trade-off such as a lowered resistance amount, deterioration of area efficiency and the like, and sufficient improvement has not been made.

SUMMARY OF THE INVENTION

In the prior-art reverse-conducting IGBT, there has been a problem of an increase in a forward voltage by snapback during the IGBT/FWD operation and an increase of steady loss.

In view of the above-described problems, an object of the present invention is to provide a semiconductor device which can reduce snapback.

According to the present invention, a semiconductor device includes: an n-type drift layer; a p-type base layer in a channel region on the n-type drift layer; an n-type emitter layer on the p-type base layer; a trench-gate electrode penetrating the p-type base layer and the n-type emitter layer and being in contact with the p-type base layer and the n-type emitter layer through a gate insulating film; a p-type anode layer in a region other than the channel region on the n-type drift layer; an emitter electrode connected to the n-type emitter layer and the p-type anode layer; a p-type collector layer below the n-type drift layer; an n-type cathode layer below the n-type drift layer; a collector electrode connected to the p-type collector layer and the n-type cathode layer; an n-type buffer layer surrounding the p-type collector layer; and a p-type separation layer surrounding the n-type cathode layer, wherein the n-type buffer layer separates the p-type collector layer and the p-type separation layer from each other, and the p-type separation layer separates the n-type cathode layer and the n-type buffer layer from each other.

In the reverse-conducting IGBT according to the present invention, an n-type buffer layer surrounds a p-type collector layer. A p-type separation layer surrounds an n-type cathode layer. The n-type buffer layer separates the p-type collector layer and the p-type separation layer from each other. The p-type separation layer separates the n-type cathode layer and the n-type buffer layer from each other. Therefore, the present invention makes it possible to reduce snapback.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

Embodiment 1

Figure 1:
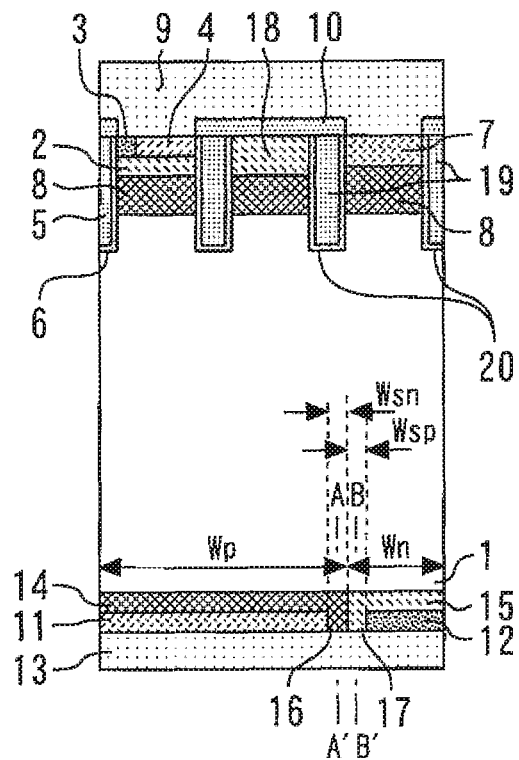
FIG. 1 is a sectional view illustrating a semiconductor device according to an embodiment 1 of the present invention.

FIG. 1 is a sectional view illustrating a semiconductor device according to an embodiment 1 of the present invention. In a channel region on an n-type drift layer 1, a p-type base layer 2 is provided. On the p-type base layer 2, an n+-type emitter layer 3 and a p+-type contact layer 4 are provided. A trench-gate electrode 5 made of polysilicon penetrates the p-type base layer 2 and the n+-type emitter layer 3 and is in contact with those layers through a gate insulating film 6.

In a region other than the channel region on the n-type drift layer 1, a p-type anode layer 7 is provided. Impurity concentration of the p-type anode layer 7 is lower than the impurity concentration of the p-type base layer 2. In the p-type anode layer 7, the p+-type contact layer 4 is not formed.

Between the n-type drift layer 1 and the p-type base layer 2, an n-type carrier storing layer 8 is provided. The n-type carrier storing layer 8 is provided also below the p-type anode layer 7. An emitter electrode 9 is connected to the n+-type emitter layer 3, the p+-type contact layer 4, and the p-type anode layer 7. The trench-gate electrode 5 and the emitter electrode 9 are separated by an inter-layer insulating film 10.

Below the n-type drift layer 1, a p+-type collector layer 11 and an n+-type cathode layer 12 are provided. A collector electrode 13 is connected to the p+-type collector layer 11 and the n+-type cathode layer 12. An n+-type buffer layer 14 surrounds the p+-type collector layer 11, and a p-type separation layer 15 surrounds the n+-type cathode layer 12. The n+-type buffer layer 14 has a high resistance n-type buffer layer boundary portion 16 which separates the p+-type collector layer 11 from the p+-type separation layer 15. The p-type separation layer 15 has a high resistance p-type separation layer boundary portion 17 which separates the n+-type cathode layer 12 from the n+-type buffer layer 14.

Between the channel region and the p-type anode layer 7 on the n-type drift layer 1, a floating region 18 not connected to the emitter electrode 9 is provided. A dummy trench-gate electrode 19 and a dummy gate insulating film 20 connected to the emitter electrode 9 and made of polysilicon separate a channel region and the p-type anode layer 7 from the floating region 18. The p-type anode layer 7 is surrounded by the dummy trench-gate electrode 19 and the dummy gate insulating film 20.

Immediately below the p-type anode layer 7, the n+-type cathode layer 12 required for an FWD operation is arranged. A ratio of a width of the p+-type collector layer 11 working as a collector during an IGBT operation to a cell width is larger than a ratio of a width of the n+-type cathode layer 12 working as a cathode during the FWD operation to the cell width (Wp/(Wn+Wp)>Wn/(Wn+Wp) is satisfied).

An n-channel MOSFET is formed of the n-type drift layer 1, the n-type carrier storing layer 8, the p-type base layer 2, the n+-type emitter layer 3, the gate insulating film 6, and the trench-gate electrode 5. An FWD is formed of the p-type anode layer 7 and the n-type carrier storing layer 8. To the n-type drift layer 1, the MOSFET and the FWD are connected in parallel.

Subsequently, a configuration for raising resistance of the n-type buffer layer boundary portion 16 and the p-type separation layer boundary portion 17 will be described. Specifically, entire concentration and surface concentration of the both are lowered, diffusion resistance and contact resistance are increased, and a width Wsn of the n-type buffer layer boundary portion 16 and a width Wsp of the p-type separation layer boundary portion 17 are formed narrow.

Figure 2:
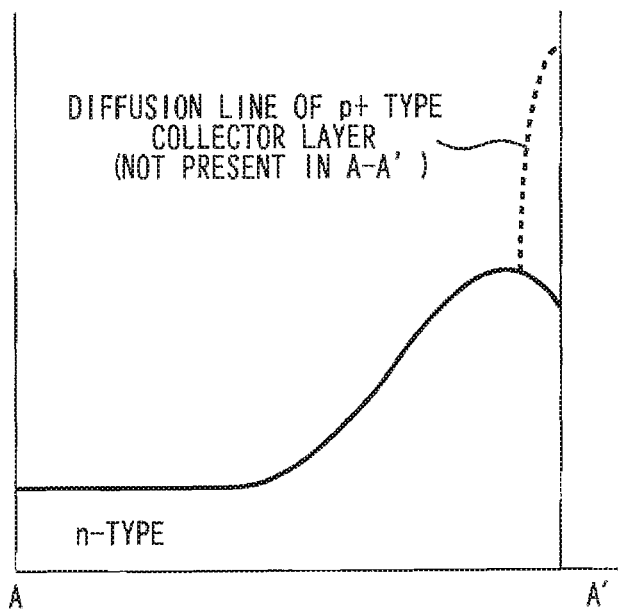
FIG. 2 is a diagram illustrating impurity concentration distribution along A-A' in FIG. 1.
Figure 3:
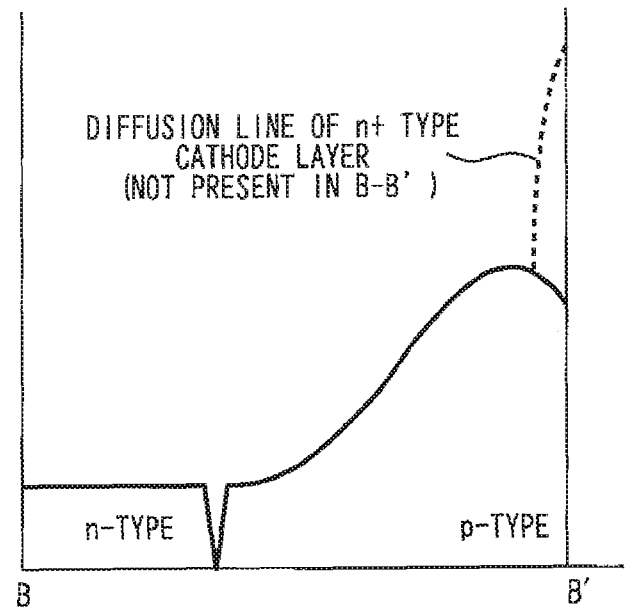
FIG. 3 is a diagram illustrating the impurity concentration distribution along B-B' in FIG. 1.

FIG. 2 is a diagram illustrating impurity concentration distribution along A-A' in FIG. 1. FIG. 3 is a diagram illustrating the impurity concentration distribution along B-B' in FIG. 1. Impurity peak concentration of the n-type buffer layer boundary portion 16 and the p-type separation layer boundary portion 17 are formed at a position deeper than a diffusion depth of the p$^+$-type collector layer 11 and the n$^+$-type cathode layer 12, respectively. That is, in a region between the p$^+$-type collector layer 11 and the n$^+$-type cathode layer 12, impurity concentration on the surfaces of the n$^+$-type buffer layer 14 and the p-type separation layer 15 in contact with the collector electrode 13 is lower than the peak concentration of each of them. Therefore, the impurity concentration of the n-type buffer layer boundary portion 16 and the p-type separation layer boundary portion 17 becomes lower as they get close to the collector electrode 13 on the back surface, the surface concentration of the both is lowered, and the resistance is raised.

Moreover, the n-type buffer layer boundary portion 16 uses a lateral diffusion region of the n$^+$-type buffer layer 14, and the p-type separation layer boundary portion 17 uses the lateral diffusion region of the p-type separation layer 15 so as to keep the concentration low. Therefore, the width Wsn and the width Wsp are preferably set to a laterally diffusing width, respectively. If a depth of the p$^+$-type collector layer 11 is set to approximately 0.3 µm at the minimum, the depth of the n$^+$-type buffer layer 14 requires to be approximately 0.7 to 1.5 µm. Since a diffusion width in a lateral direction has a rate lower than the diffusion width in a vertical direction, if its value is assumed to be a general value of 0.75, the width of the n-type buffer layer boundary portion 16 needs to be approximately 0.5 to 1.1 µm. Assuming that it also applies to the relationship between the n$^+$-type cathode layer 12 and the p-type separation layer 15, an interval between the p$^+$-type collector layer 11 and the n$^+$-type cathode layer 12 is preferably approximately 1.0 to 2.2 µm.

Alternatively, the width Wsn and the width Wsp are preferably set to minimum widths determined by capacity of a photolithography device used in a manufacturing process. In the photolithography device used in manufacture of a semiconductor, superposition misalignment can be kept to 2 µm or less even without using a state-of-art device. From the above reason, the interval between the p$^+$-type collector layer 11 and the n$^+$-type cathode layer 12 is preferably 2 µm or less or possibly 1.0 µm or less.

Figure 4:
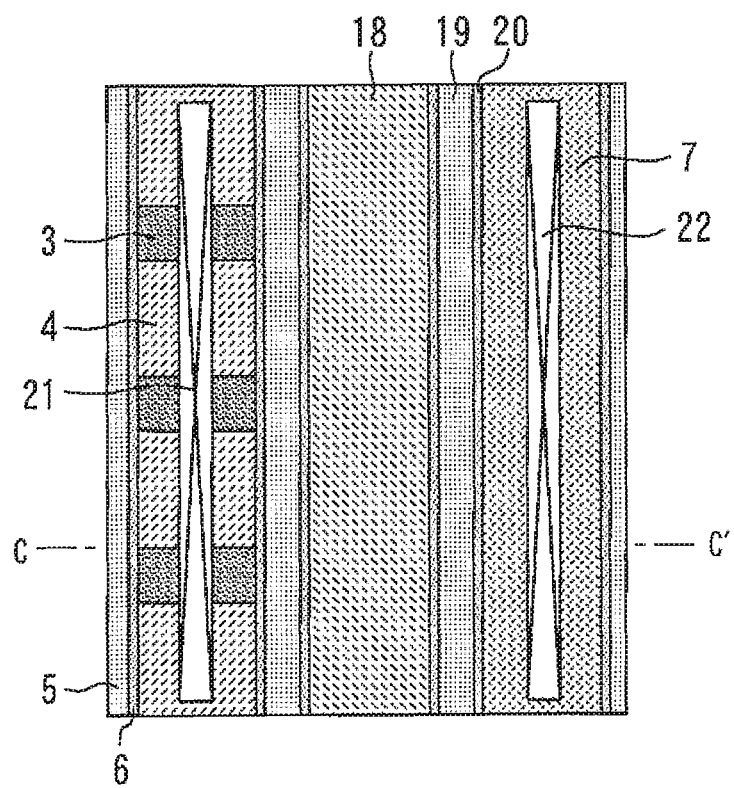
FIG. 4 is a plan view illustrating a semiconductor device according to the embodiment 1 of the present invention.

FIG. 4 is a plan view illustrating a semiconductor device according to the embodiment 1 of the present invention. A sectional view along C-C' in FIG. 4 corresponds to FIG. 1. A surface structure of the semiconductor device is configured in a stripe type. The n$^+$-type emitter layer 3 and the p$^+$-type contact layer 4 are connected to the emitter electrode 9 through a contact hole 21. The p-type anode layer 7 is connected to the emitter electrode 9 through the contact hole 22.

Subsequently, an operation of the semiconductor device according to this embodiment will be described. During a steady operation in a forward direction of the IGBT, the MOSFET is turned on. Therefore, an electron flows into the n-type drift layer 1 from the emitter electrode 9. Subsequently, the electron current flows into the n$^+$-type buffer layer 14 and flows into the collector electrode 13 through the n-type buffer layer boundary portion 16. At this time, the n-type buffer layer boundary portion 16 is set to high resistance, and p-n junction formed in the p$^+$-type collector layer 11 and the n$^+$-type buffer layer 14 is forward-biased with an extremely low current. Then, a positive hole flows into the n-type drift layer 1 from the p$^+$-type collector layer 11 through the n$^+$-type buffer layer 14, conductivity modulation occurs, and the steady state is reached. In the off state, the MOSFET is turned off, and an excessive carrier inside is emitted from the p-type base layer 2, the p$^+$-type contact layer 4, and the p-type anode layer 7 to the emitter electrode 9.

During the FWD operation, the operation starts in a state in which a potential of the emitter electrode 9 is higher than the potential of the collector electrode 13. The operation at this time is different depending on the gate potential, but a case used in general in which a gate voltage is positive will be described here. The trench-gate electrode 5 is positive, and the MOSFET is on.

When the FWD proceeds to an on state, the electron current flows into the n-type drift layer 1 from the n$^+$-type cathode layer 12, but in the prior-art structure, the electron current does not flow to the diode, first, but flows into the MOSFET, and a snapback operation occurs. On the other hand, in this embodiment, the p-type anode layer 7 is provided through the floating region not emitter-grounded, and the high resistance n-type drift layer 1 is arranged immediately below the floating region. Thus, only inflow of a small amount of electrons into the channel region easily turns on the p-n junction formed between the p-type anode layer 7 and the n-type carrier storing layer 8, and the positive hole flows in from the emitter electrode 9. Conductivity modulation occurs by that, and the steady state with a low inter-terminal voltage is reached.

In turning off, the operation starts when the potential of the emitter electrode 9 becomes lower than the potential of the collector electrode 13. As a basic operation, the current decreases while the p-n junction between the p-type base layer 2 and the p$^+$-type contact layer 4 or the p-type anode layer 7 is forward-biased. After that, the polarity is reversed, the current increases, and forward bias of the p-n junction in the vicinity of the junction is cancelled, and the increase in the current stops. The excessive carrier inside the n-type drift layer 1 is discharged, and the operation is completed (recovery operation).

Subsequently, a manufacturing method of the semiconductor device according to this embodiment will be described. FIGS. 5 to 13 are sectional views illustrating a manufacturing process of the semiconductor device according to the embodiment 1 of the present invention.

Figure 5:
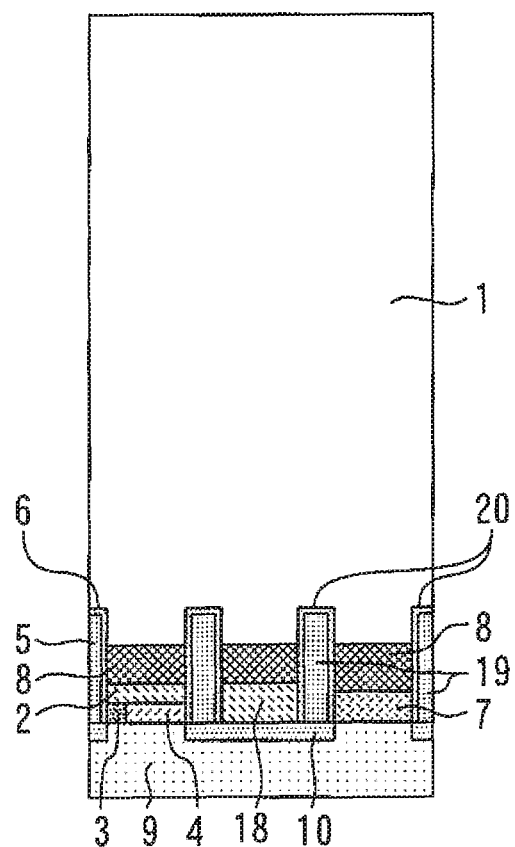
FIGS. 5 to 13 are sectional views illustrating a manufacturing process of the semiconductor device according to the embodiment 1 of the present invention.

First, as illustrated in FIG. 5, the surface structure of the semiconductor device is formed by using a photolithography process, an injection process, a diffusion/film-forming process and the like. Since it can be made by general manufacturing processes, the details will be omitted.

Figure 6:
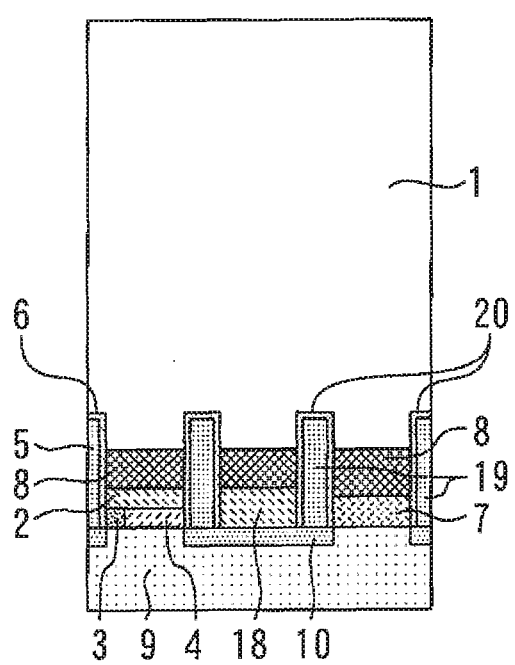
Figure 7:
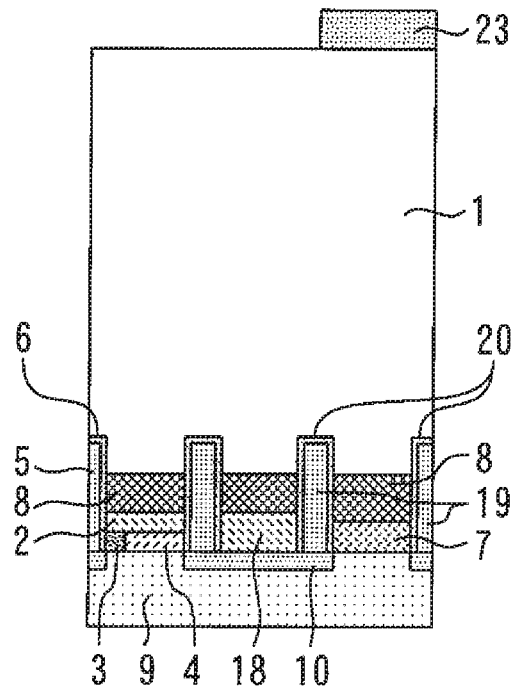
Figure 8:
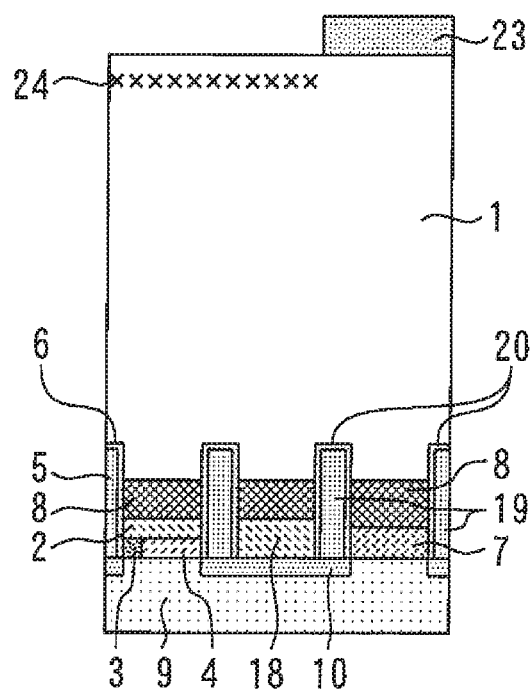

Subsequently, as illustrated in FIG. 6, a wafer is ground from a back-surface direction and thinned. Subsequently, as illustrated in FIG. 7, a resist pattern 23 for forming the n$^+$-type buffer layer 14 and the p$^+$-type collector layer 11 is formed on the back surface by using the photolithography technology. At this time, regions for forming the n$^+$-type buffer layer 14 and the p-type separation layer 15 are overlapped by approximately 2 µn, Subsequently, as illustrated in FIG. 8, n-type impurities are injected at a position which is relatively deep from the back surface so as to form an n-type buffer layer forming region 24. At this time, it is configured such that a concentration peak becomes deeper than a diffusion depth of the p$^+$-type collector layer 11 after heat treatment later.

Figure 9:
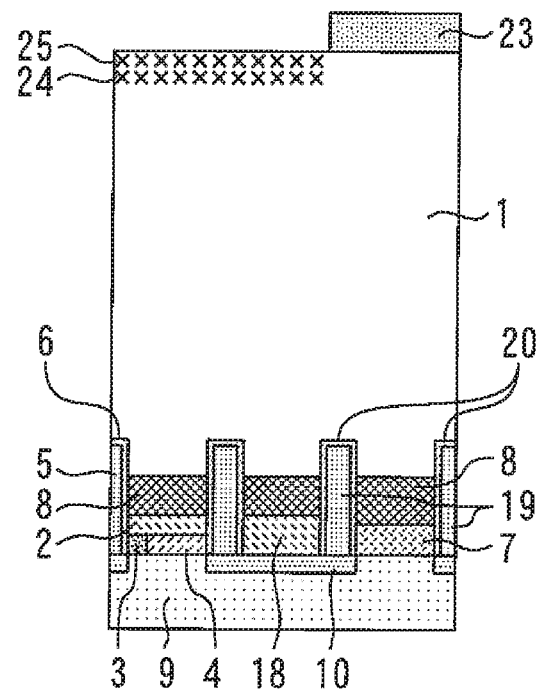
Figure 10:
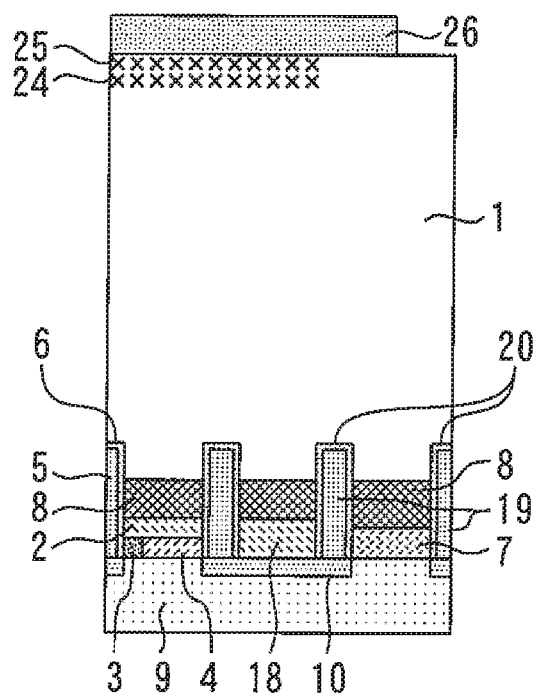

Subsequently, as illustrated in FIG. 9, p-type impurities are injected at a position which is shallow from the back surface so as to form a p$^+$-type collector layer forming region 25. After that, the resist pattern 23 is removed. Subsequently, as illustrated in FIG. 10, a resist pattern 26 for forming the p-type separation layer 15 and the n$^+$-type cathode layer 12 is formed by using the similar photolithography process. At this time, regions for forming the $n^+$-type buffer layer 14 and the p-type separation layer 15 are overlapped by approximately 2 μm.

Figure 11:
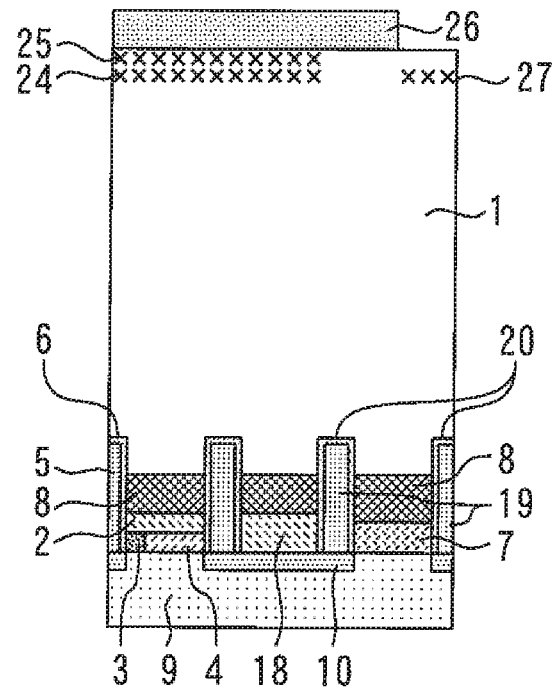
Figure 12:
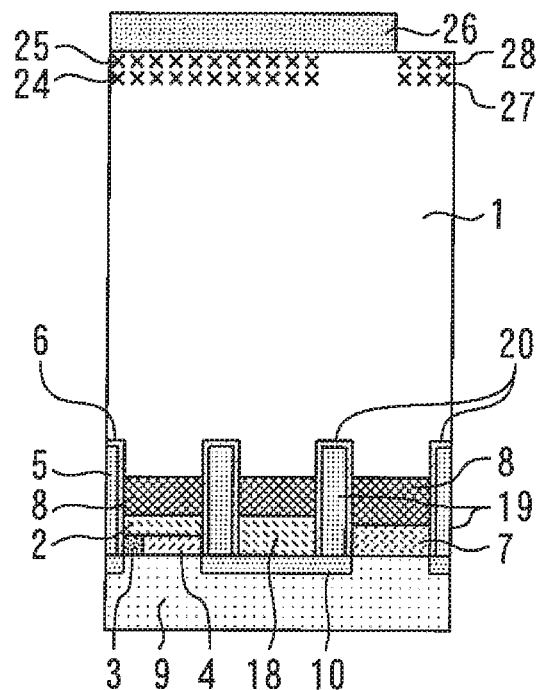

Subsequently, as illustrated in FIG. 11, the p-type impurities are injected at a position which is relatively deep from the back surface so as to form a p-type separation layer forming region 27. At this time, it is configured such that the concentration peak becomes deeper than the diffusion depth of the $n^+$-type cathode layer 12 after the heat treatment later. Subsequently, as illustrated in FIG. 12, the n-type impurities are injected at a position which is shallow from the back surface so as to form an $n^+$-type cathode layer forming region 28.

Figure 13:
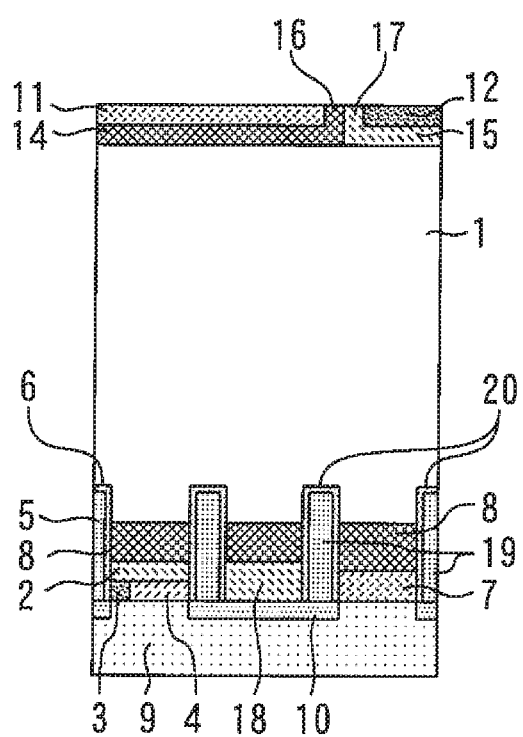

Subsequently, as illustrated in FIG. 13, by removing an injection pattern and by applying the heat treatment, the $n^+$-type buffer layer 14, the $p^+$-type collector layer 11, and the $n^+$-type cathode layer 12, the p-type separation layer 15 are formed. Subsequently, the semiconductor device according to this embodiment can be manufactured by forming a film of the collector electrode 13 on the back side by using a general semiconductor technology.

In this embodiment, the $n^+$-type buffer layer 14 surrounding the $p^+$-type collector layer 11, the p-type separation layer 15 surrounding the $n^+$-type cathode layer 12, the high resistance n-type buffer layer boundary portion 16 and the p-type separation layer boundary portion 17 arranged between them are provided. As a result, snapback during the IGBT/FWD operation is reduced, and steady loss can be reduced.

Moreover, the p-type anode layer 7 with low concentration is arranged at a place away from the channel region including the $n^+$-type emitter layer 3 through the floating region. In the on state and when the gate voltage is positive, since the potential of the p-type base layer 2 is close to the emitter potential, the positive holes cannot easily flow. Thus, the current flows to the p-type anode layer 7, and many carriers accumulate there. Therefore, in the recovery state, many of the carriers are discharged through the p-type anode layer 7. At this time, since the p-type anode layer 7 is formed with low concentration, the forward bias of the p-n junction is rapidly cancelled, and the off state is reached without an increase in a recovery current (Irr). Therefore, the recovery current can be reduced. Moreover, since the n-type carrier storing layer 8 below the p-type anode layer 7 works in a direction of suppressing the injection of the positive holes, the recovery current can be suppressed more effectively.

Figure 14:
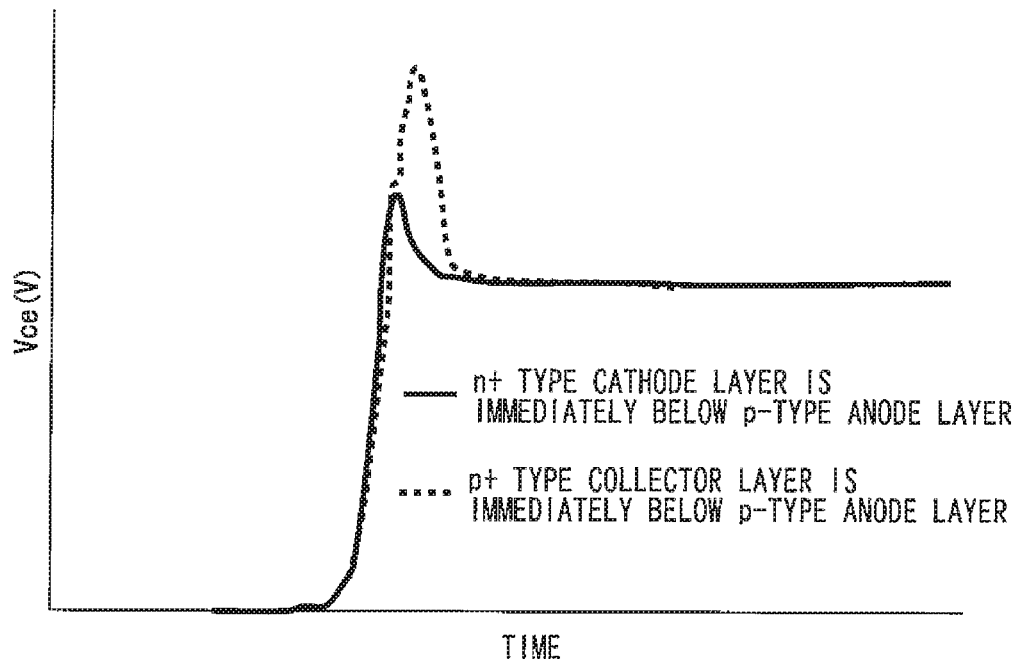
FIG. 14 is a diagram illustrating a difference in turn-off waveform of the IGBT between the case when the p+-type collector layer is arranged immediately below the p-type anode layer and the case when the n+-type cathode layer is arranged.

FIG. 14 is a diagram illustrating a difference in turn-off waveform of the IGBT between the case when the $p^+$-type collector layer is arranged immediately below the p-type anode layer and the case when the $n^+$-type cathode layer is arranged. If the $n^+$-type cathode layer 12 is not arranged immediately below the p-type anode layer 7, since translocation to the FWD is not performed until the p-type separation layer 15 and the $n^+$-type cathode layer 12 are forward-biased, a voltage increases until translocation. Therefore, a turn-off surge becomes larger, and a loss increases. On the other hand, as in this embodiment, by arranging at least a part of the p-type separation layer 15 and the $n^+$-type cathode layer 12 working as a cathode immediately below the p-type anode layer 7 working as an anode during the FWD operation, a current can be effectively supplied, and a surge can be reduced. Moreover, since the p-n junction on the back surface can be turned on more easily during the FWD operation, transition Vf can be reduced, and a loss can be reduced.

Figure 15:
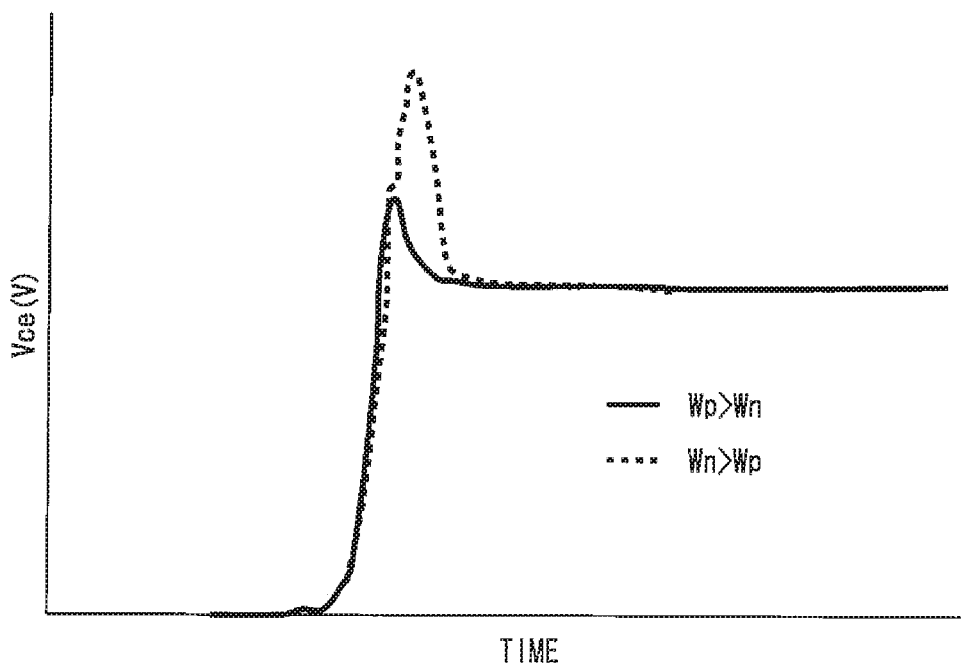
FIG. 15 is diagram illustrating a difference in the turn-off waveform of the IGBT according to a relationship in size between the width Wp of the p+-type collector layer and the width Wn of the n+-type cathode layer.

FIG. 15 is diagram illustrating a difference in the turn-off waveform of the IGBT according to a relationship in size between the width Wp of the $p^+$-type collector layer and the width Wn of the $n^+$-type cathode layer. If the ratio of the width of the $p^+$-type collector layer 11 working as a collector during the IGBT operation to the cell width (Wp/(Wp+Wn)) is larger than the ratio of the width of the $n^+$-type cathode layer 12 working as a cathode during the FWD operation to the cell width (Wn/(Wp+Wn)), that is, if the width Wp of the $p^+$-type collector layer 11 is larger than the width Wn of the $n^+$-type cathode layer 12, a surge voltage at turn-off of the switching element working in a pair with the FWD can be reduced, and a switching loss can be reduced, and moreover, a steady loss during the IGBT operation can be reduced. That is because reduction of Vice (sat) of the IGBT and snapback suppression are realized by increasing Wp and the p-type separation layer 15 and the $n^+$-type cathode layer 12 can be easily forward-biased by reducing Wn.

By means of the combination of the structures of this embodiment, snapback can be avoided even if a pitch is made smaller both on the front/back surfaces as compared with a repetition width of the prior-art anode-short type structure. As a result, the IGBT/FWD operates uniformly in the same region, and area efficiency is improved, and costs can be reduced.

Moreover, by connecting the dummy trench-gate electrode 19 surrounding the p-type anode layer 7 to the emitter electrode 9, the gate capacity can be reduced, and the size of a drive circuit when the gate is driven can be made smaller. The electrode surrounding the p-type anode layer 7 is constituted by the dummy trench electrode 19, but it may be also constituted by the trench-gate electrode 5, and an effect of reduction of snapback and reduction of a recovery current can be obtained.

Figure 16:
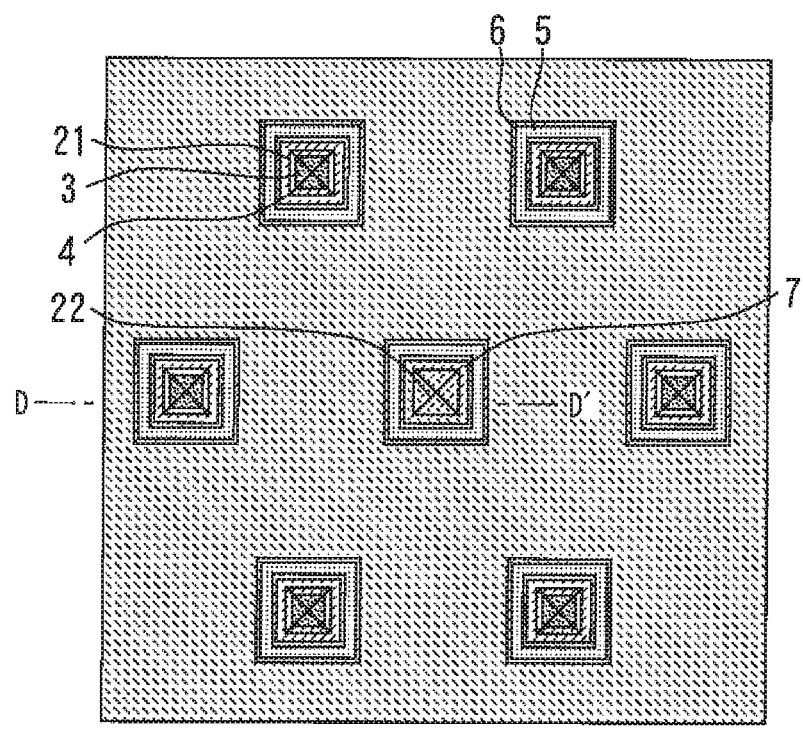
FIG. 16 is a plan view illustrating a variation 1 of the semiconductor device according to the embodiment 1 of the present invention.
Figure 17:
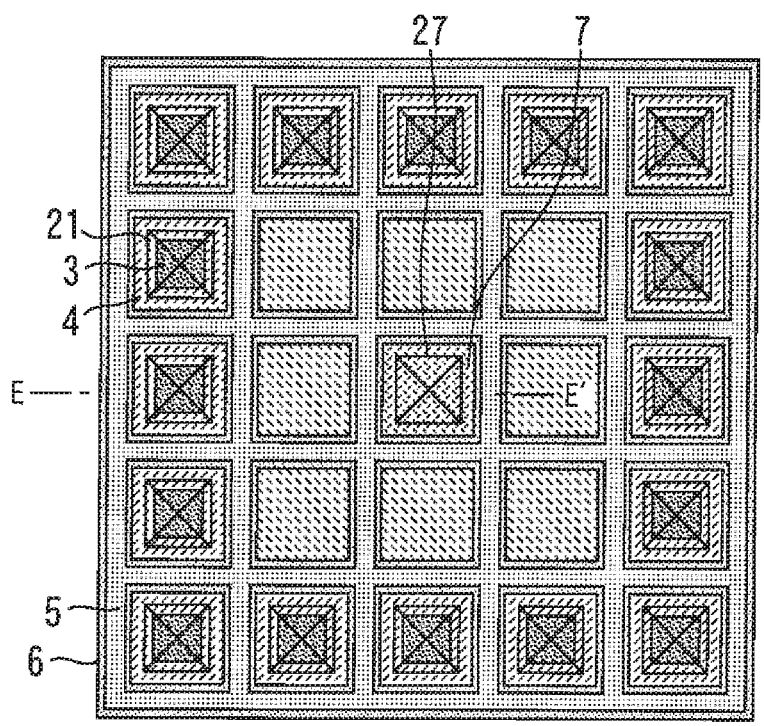
FIG. 17 is a plan view illustrating a variation 2 of the semiconductor device according to the embodiment 1 of the present invention.

FIG. 16 is a plan view illustrating a variation 1 of the semiconductor device according to the embodiment 1 of the present invention. A sectional view along D-D' in FIG. 16 corresponds to FIG. 1. A channel region including the $n^+$-type emitter layer 3 is arranged at an apex of a regular hexagon, and a p-type anode layer 7 is arranged at its center. FIG. 17 is a plan view illustrating a variation 2 of the semiconductor device according to the embodiment 1 of the present invention. A sectional view along E-E' in FIG. 17 corresponds to FIG. 1. The trench-gate electrode 5 is arranged in a mesh state, the p-type anode layer 7 is arranged at its center, and a channel region portion including the $n^+$-type emitter layer 3 is arranged on an outer periphery. A wiring connecting to the channel region portion is omitted in the figure. In the cases of these planar structures, the effect similar to this embodiment can be also obtained.

Embodiment 2

Figure 18:
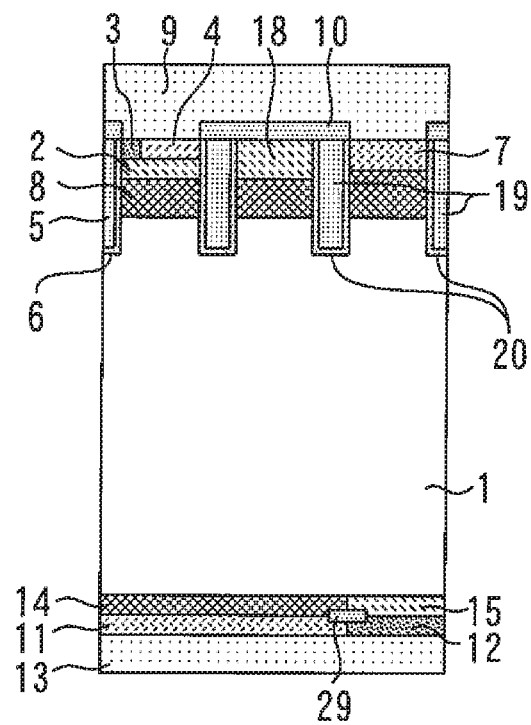
FIG. 18 is a sectional view illustrating a semiconductor device according to an embodiment 2 of the present invention.

FIG. 18 is a sectional view illustrating a semiconductor device according to an embodiment 2 of the present invention. The $n^+$-type buffer layer 14 is provided between the n-type drift layer 1 and the $p^+$-type collector layer 11, and the p-type separation layer 15 is provided between the n-type drift layer 1 and the $n^+$-type cathode layer 12. An embedded oxide film 29 separates the $p^+$-type collector layer 11 and the p-type separation layer 15 from each other and separates the $n^+$-type cathode layer 12 and the $n^+$-type buffer layer 14 from each other.

When the embedded oxide film 29 is to be formed, first, a pattern is formed by using a general photolithography technology, and oxygen is injected to a predetermined spot by using an impurity injection technology. After the pattern is removed, by applying heat treatment, the embedded oxide film 29 is formed. The other structures can be formed by using the manufacturing method similar to the embodiment 1.

Subsequently, an operation of the semiconductor device according to this embodiment will be described. For the operation similar to the embodiment 1, the explanation will be omitted. When an IGBT is operated to be ON, an electron current flows in from the emitter electrode 9 to the back surface. At that time, since the $n^+$-type buffer layer 14 and the $n^+$-type cathode layer 12 are electrically separated through the embedded oxide film 29, the current does not flow into the $n^+$-type cathode layer 12 but flows into the $p^+$-type collector layer 11 from the $n^+$-type buffer layer 14. As a result, positive holes flow from the $p^+$-type collector layer 11, conductivity modulation occurs, and the ON state is realized. In this embodiment, there is no snapback during the IGBT operation, and there is no loss increase caused by snapback.

At the FWD, since the $p^+$-type collector layer 11 and the $p^+$-type separation layer 15 are insulated by the embedded oxide film 29, the positive holes having flowed in from the p-type anode layer 7 does not flow to the $p^+$-type collector layer 11 but flows into the $n^+$-type cathode layer 12. As a result, a conductivity modulation operation of the diode starts. Since no snapback behavior is shown in the operation in this direction, there is no loss increase caused by snapback.

Moreover, since an oxide film is not formed on a boundary between the collector electrode 13 and a Si layer as in the prior-art example, the shape becomes flat. As a result, heat resistance on the back surface can be kept low, and thus, problems such as lowered resistance amount of short-circuit caused by a local temperature rise and the like can be avoided.

Embodiment 3

Figure 19:
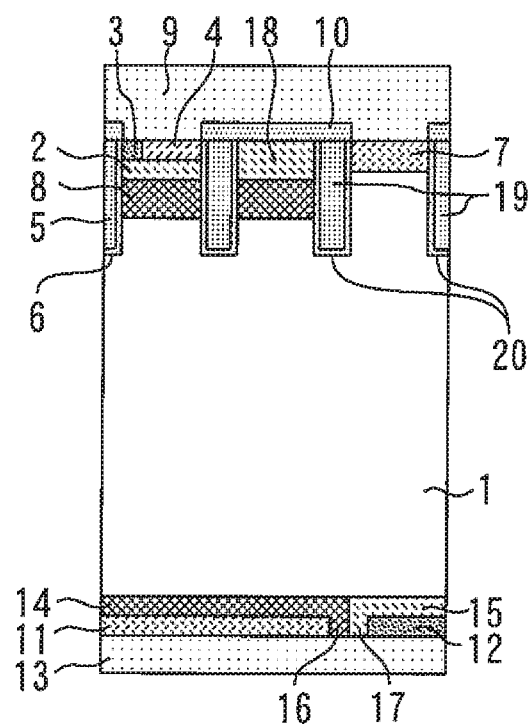
FIG. 19 is a sectional view illustrating a semiconductor device according to an embodiment 3 of the present invention.

FIG. 19 is a sectional view illustrating a semiconductor device according to an embodiment 3 of the present invention. There is no n-type carrier storing layer 8 in this embodiment. By eliminating the n-type carrier storing layer 8, injection of the positive holes can be increased, and snapback during the FWD operation can be particularly reduced. Particularly if a repetition interval of the surface structure is short, an effect of realizing reduction of snapback and reduction of the recovery current at the same time is high.

Embodiment 4

Figure 20:
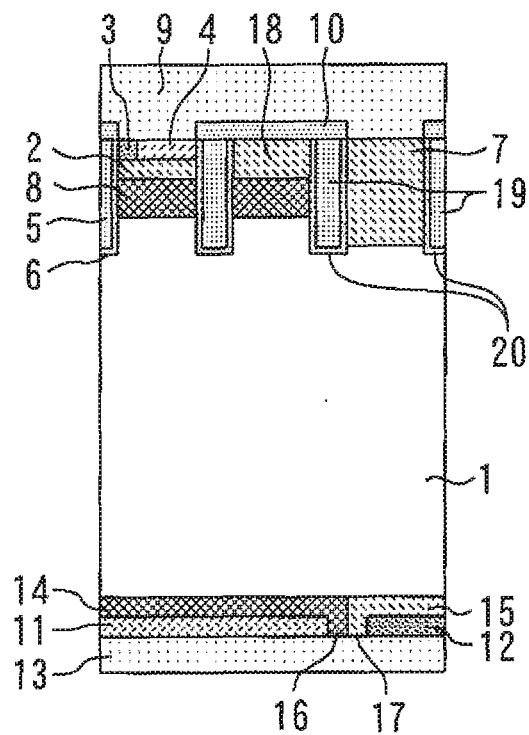
FIG. 20 is a sectional view illustrating a semiconductor device according to an embodiment 4 of the present invention.

FIG. 20 is a sectional view illustrating a semiconductor device according to an embodiment 4 of the present invention. In the embodiment 1, the n-type carrier storing layer 8 is provided immediately below the p-type anode layer 7, but in this embodiment, the p-type anode layer 7 with low concentration extends to the bottom portion of the dummy trench-gate electrode 19.

By eliminating the n-type carrier storing layer 8, the injection of the positive holes can be increased, and particularly, snapback during the FWD operation can be reduced. Moreover, by forming the deep and low-concentration p-type anode layer 7, snapback can be further reduced, and a recovery loss can be also reduced. This embodiment is effective for a structure with a short repetition interval of the surface structure similarly to the embodiment 3.

Ideally, the deep and low concentration p-type anode layer 7 is formed, but if there is a process of introducing a deep and high concentration p-type impurity in the manufacturing process, the p-type anode layer 7 may be formed at the same time as the high concentration p-type impurity layer. As a result, the structure of this embodiment can be realized without increasing the manufacturing processes.

Figure 21:
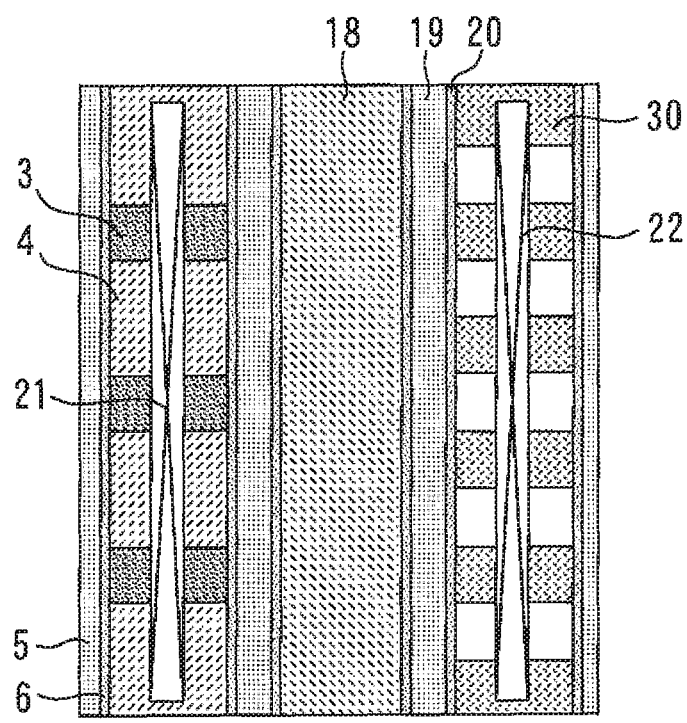
FIG. 21 is a plan view illustrating a semiconductor device according to the embodiment 4 of the present invention.

FIG. 21 is a plan view illustrating a semiconductor device according to the embodiment 4 of the present invention. By calculating a ratio so that entire impurity concentration becomes the design concentration of the p-type anode layer 7 and by arranging a plurality of high concentration p-type impurity layers 30 in a distributed manner, the effective p-type anode layer 7 can be formed.

Embodiment 5

Figure 22:
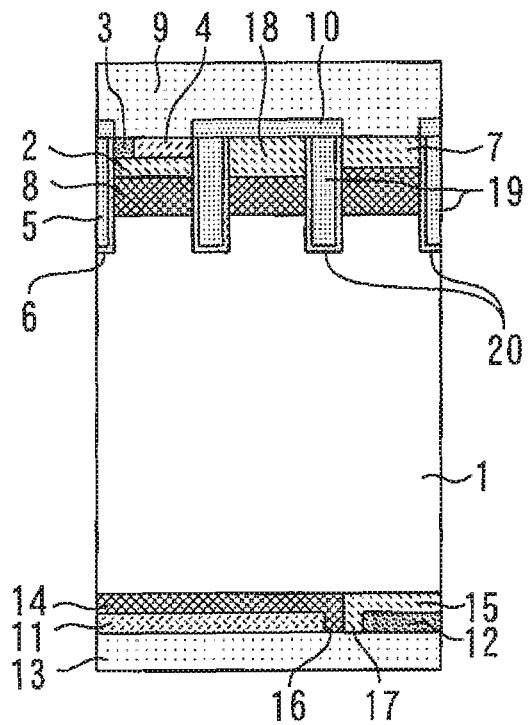
FIG. 22 is a sectional view illustrating a semiconductor device according to an embodiment 5 of the present invention.

FIG. 22 is a sectional view illustrating a semiconductor device according to an embodiment 5 of the present invention. The impurity concentration of the p-type anode layer 7 and the p-type base layer 2 is the same. Thus, the p-type anode layer 7 can be formed with the p-type base layer 2 at the same time. Thus, the effect similar to the embodiment 1 can be obtained without increasing the manufacturing cost.

Embodiment 6

Figure 23:
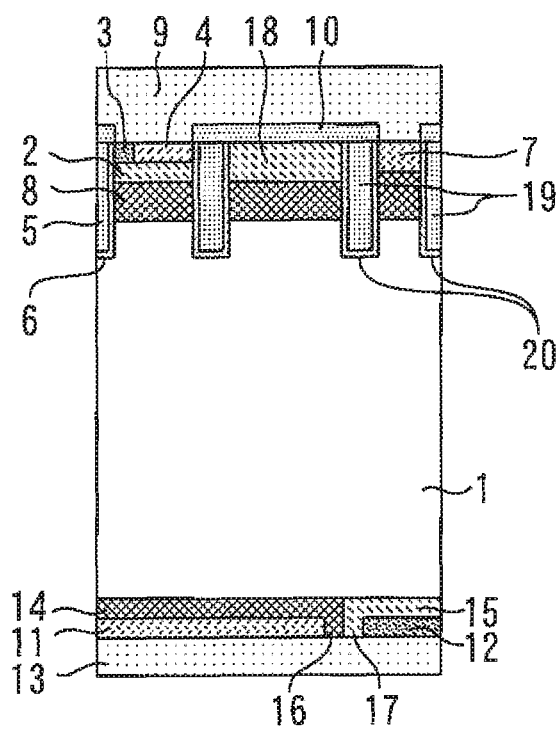
FIG. 23 is a sectional view illustrating a semiconductor device according to an embodiment 6 of the present invention.

FIG. 23 is a sectional view illustrating a semiconductor device according to an embodiment 6 of the present invention. As compared with the embodiment 1, the width of the p-type anode layer 7 is made smaller. As a result, injection efficiency of the positive holes flowing in from the p-type anode layer 7 is lowered, and a recovery current can be lowered. This is effective if the entire loss reduction can be realized by lowering the recovery current. The manufacturing process is the same as the embodiment 1. Moreover, the recovery current can be further reduced by application at the same time as the feature of the embodiment 5.

Embodiment 7

Figure 24:
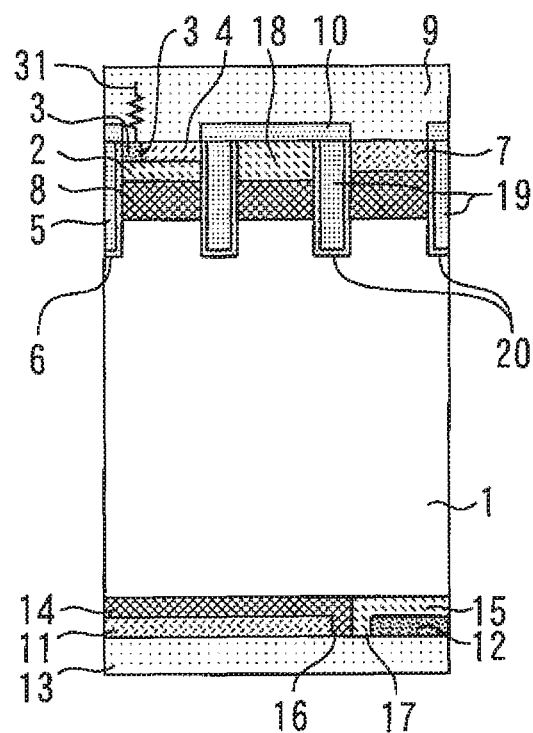
FIG. 24 is a sectional view illustrating a semiconductor device according to an embodiment 7 of the present invention.

FIG. 24 is a sectional view illustrating a semiconductor device according to an embodiment 7 of the present invention. As compared with the embodiment 1, an emitter connection resistor 31 is connected between the emitter electrode 9 and the $n^+$-type emitter layer 3.

When the FWD operation mode is performed in the embodiment 1, since the MOSFET is turned on if the positive voltage is being applied to the trench-gate electrode 5, the electron current does not flow to the p-n junction formed by the p-type anode layer 7 and the n-type carrier storing layer 8 but flows into the MOSFET, first. On the other hand, a DC resistor is connected to the MOSFET in this embodiment, and a voltage drop occurs by the flow of the electron current, and thus, the current can easily flow to the p-n junction of the p-type anode layer 7 and the n-type carrier storing layer 8. Thus, by generating conductivity modulation more effectively, snapback can be reduced/suppressed so as to reduce a loss during the FWD operation.

Figure 25:
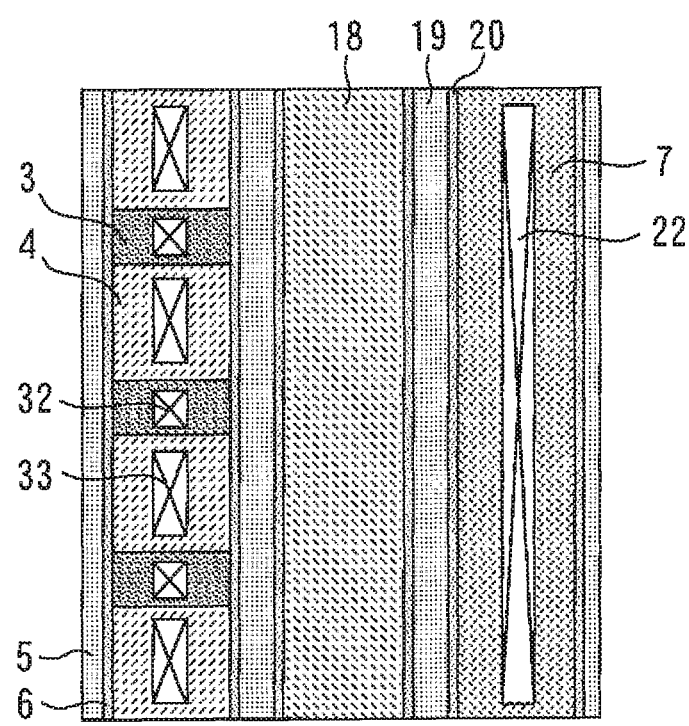
FIG. 25 is a plan view illustrating a semiconductor device according to an embodiment 7 of the present invention.

FIG. 25 is a plan view illustrating a semiconductor device according to an embodiment 7 of the present invention. A first contact hole 32 connects the $n^+$-type emitter layer 3 and the emitter electrode 9, and a second contact hole 33 connects the p-type base layer 2 and the emitter electrode 9. The first contact hole 32 and the second contact hole 33 are separated from each other. As a result, the voltage drop generated in the first contact hole 32 becomes larger than in the case in which the contact holes are formed integrally, and the emitter connection resistor 31 can be realized. Moreover, by making the area of the first contact hole 32 smaller than the area of the second contact hole 33, the contact resistance becomes higher, and the effect of this embodiment can be obtained more easily. Since this embodiment can be formed with the flow similar to that of the embodiment 1 by changing the pattern of the contact hole, detailed description of the manufacturing process will be omitted.

The surface concentration of the $n^+$-type emitter layer 3 may be made lower than the peak concentration. As a result, since the impurity concentration of the $n^+$-type emitter layer 3 becomes lower as it gets closer to the emitter electrode 9, the emitter connection resistor 31 can be realized.

Embodiment 8

Figure 26:
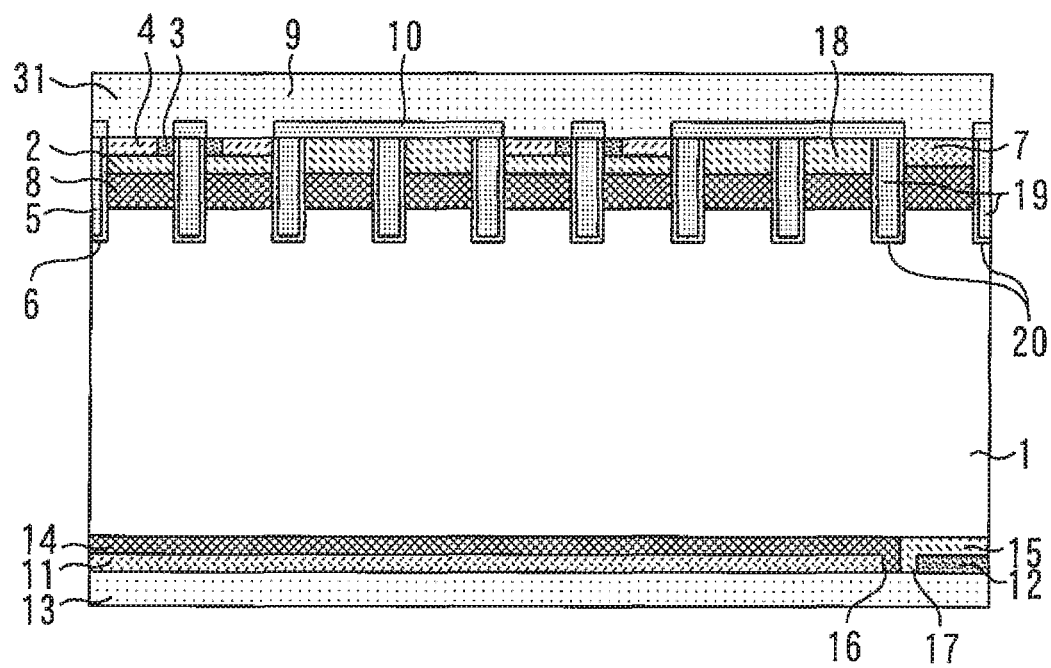
FIG. 26 is a sectional view illustrating a semiconductor device according to an embodiment 8 of the present invention.

FIG. 26 is a sectional view illustrating a semiconductor device according to an embodiment 8 of the present invention. As compared with the embodiment 1, a floating region between the channel region in which the n-channel MOSFET is formed and a region in which the p-type anode layer 7 is formed is made wider. As a result, snapback found in the forward characteristics during the FWD operation can be effectively reduced. Moreover, by reducing the area ratio of the p-type anode layer 7, the recovery current is reduced, and a loss can be reduced. In this embodiment, one p-type anode layer 7 is provided for two channel regions, but this is not limiting and by providing one p-type anode layer 7 for a plurality of channel regions, free design can be realized so that the characteristics of the IGBT and the diode become desired characteristics.

Figure 27:
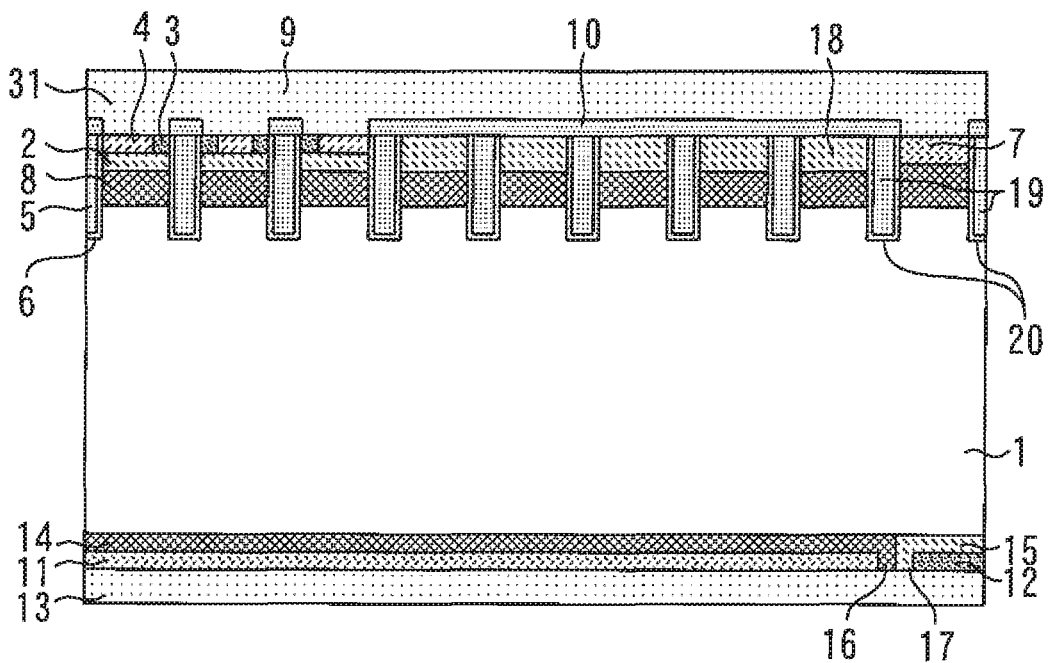
FIG. 27 is a sectional view illustrating a variation of a semiconductor device according to an embodiment 8 of the present invention.

FIG. 27 is a sectional view illustrating a variation of a semiconductor device according to an embodiment 8 of the present invention. The floating region is made wider than that in the device in FIG. 26. As a result, more effects can be obtained.

Embodiment 9

Figure 28:
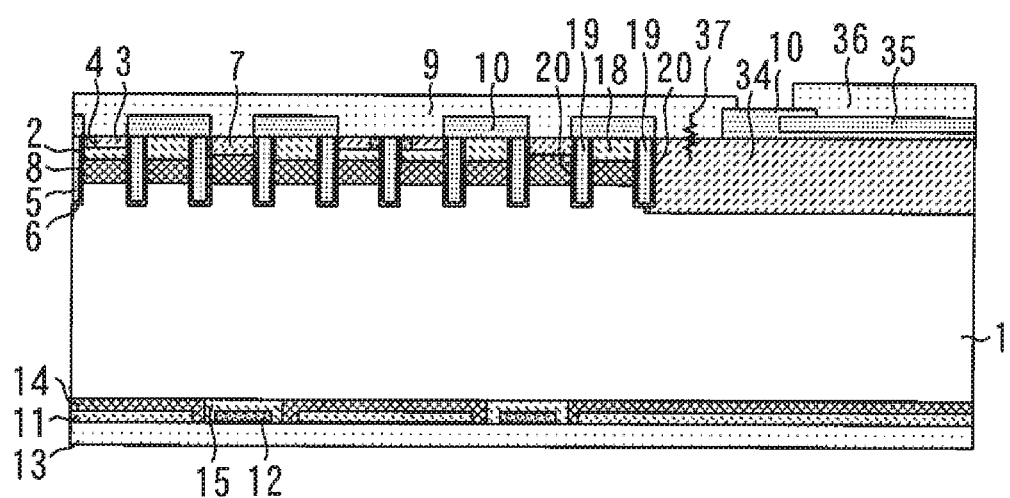
FIG. 28 is a sectional view illustrating a semiconductor device according to an embodiment 9 of the present invention.

FIG. 28 is a sectional view illustrating a semiconductor device according to an embodiment 9 of the present invention. In an active region, a cell having the characteristics of the embodiment 1 is repeatedly arranged. In a terminal region, a $p^+$-type well layer 34 having a depth larger than the depth of the trench-gate electrode 5 is provided. The $p^+$-type well layer 34 is connected to the emitter electrode 9. On the $p^+$-type well layer 34, a polysilicon electrode 35 and an aluminum electrode 36 are formed in order through the inter-layer insulating film 10.

An emitter connection resistor 37 is connected between the $p^+$-type well layer 34 and the emitter electrode 9. Immediately below the $p^+$-type well layer 34, the $p^+$-type collector layer 11 and the $n^+$-type buffer layer 14 are provided, and the $n^+$-type cathode layer 12 and the p-type separation layer 15 are not provided.

An operation of the semiconductor device according to this embodiment will be described. In the FWD operation mode, the emitter electrode 9 works as an anode side of the diode. The p-type impurity regions connected to the emitter electrode 9 are the $p^+$-type contact layer 4, the p-type base layer 2, the p-type anode layer 7, and the $p^+$-type well layer 34.

The $p^+$-type well layer 34 is diffusion used for holding a withstanding voltage such as a guard ring and needs to be set with a relatively high concentration, and thus, a large quantity of the positive holes flow from the emitter electrode 9 and increase the recovery current. Thus, in this embodiment, the $n^+$-type cathode layer 12 is not provided immediately below this $p^+$-type well layer 34 but the $p^+$-type collector layer 11 is provided, and thus, electrons are not supplied from the collector electrode 13 immediately below. As a result, since the FWD operation itself of the $p^+$-type well layer 34 is suppressed, loss/lowering caused by an increase in the recovery current can be suppressed. In this embodiment, the $p^+$-type collector layer 11 and the $n^+$-type buffer layer 14 are provided immediately below the $p^+$-type well layer 34, but by providing at least the $p^+$-type collector layer 11, the effect can be obtained.

Moreover, the emitter connection resistor 37 is connected between the emitter electrode 9 and the $p^+$-type well layer 34. By providing a resistor in a current path performing the FWD operation as above, a forward bias of the p-n junction of the $p^+$-type well layer 34 and the n-type drift layer 1 during the FWD operation is reduced, and the positive holes flowing in from the $p^+$-type well layer 34 decreases. Therefore, the conductivity modulation of this region decreases, and the increase in the recovery current can be suppressed.

Figure 29:
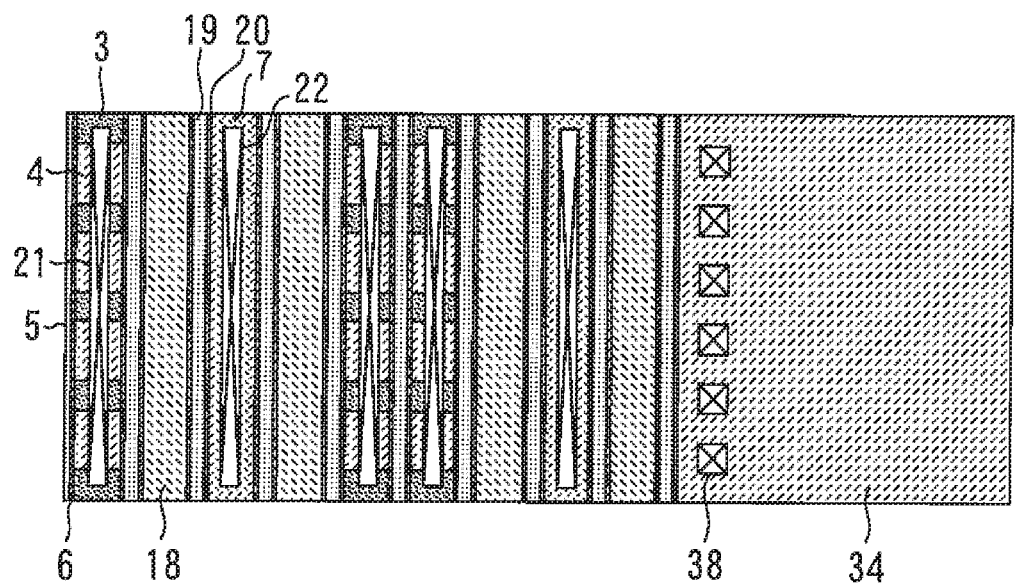
FIG. 29 is a top view illustrating a semiconductor device according to an embodiment 9 of the present invention.

FIG. 29 is a top view illustrating a semiconductor device according to an embodiment 9 of the present invention. By forming a contact hole 38 connecting the emitter electrode 9 to the $p^+$-type well layer 34 in a dot state, the emitter connection resistor 37 is realized. Since this method can be handled only by changing a pattern of a photoengraving in the manufacturing process of the contact hole 38, a rise in the manufacturing cost can be prevented.

Embodiment 10

Figure 30:
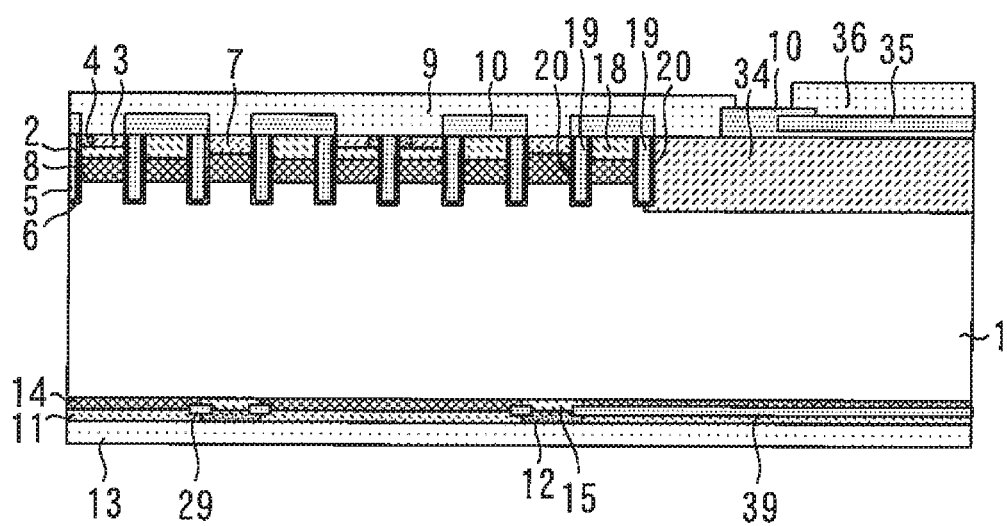
FIG. 30 is a sectional view illustrating a semiconductor device according to an embodiment 10 of the present invention.

FIG. 30 is a sectional view illustrating a semiconductor device according to an embodiment 10 of the present invention. In the active region, a cell having the features of the embodiment 1 is repeatedly arranged. In the terminal region, the $p^+$-type well layer 34 having a depth deeper than that of the trench-gate electrode 5 is provided. An embedded oxide film 39 is provided between the n-type drift layer 1 and the collector electrode 13 immediately below the $p^+$-type well layer 34.

A main path flowing in from the $p^+$-type well layer 34 in the FWD operation mode is shut off by the embedded oxide film 39, and there is no current flowing in from immediate below, including the recovery current, any more, and thus, the recovery current becomes small, and a loss is reduced. Moreover, since irregularity of the back-surface electrode can be reduced, radiation performances are improved, and problems such as lowered resistance amount of short-circuit caused by a local temperature rise and the like can be avoided.

In the embodiments 9 and 10, the cell structure has the feature of the embodiment 1, but the embodiments 1 to 8 may be applied. Moreover, it can be also applied to a structure in which polarity of p-type/n-type is reversed. Moreover, even if the cell structure is not the IGBT, it can be applied to a structure using a body diode as an FWD as in power MOSFET, whereby snapback and the recovery current during the FWD operation can be reduced. In addition to them, each of the embodiments can be combined with each other.

The semiconductor device is not limited to those formed of silicon but may be those formed of a wide band-gap semiconductor having a band bap larger than silicon. The wide band-gap semiconductor includes silicon carbide, gallium nitride material or diamond, for example.

The semiconductor device formed of such wide band-gap semiconductor has high voltage withstanding performances and allowable current density, and thus, the size can be reduced. Moreover, by using this size-reduced semiconductor device, a size of a semiconductor module incorporating this semiconductor device can be also reduced. Moreover, since heat resistance of the semiconductor device is high, a size of a radiator fin of a heat sink can be reduced, and a water cooling portion can be made into an air cooling portion, and thus, the size of the semiconductor module can be further reduced. Moreover, since the semiconductor device has a low power loss and high efficiency, the efficiency of the semiconductor module can be improved.

Obviously many modifications and variations of the present invention are possible in the light of the above teachings. It is therefore to be understood that within the scope of the appended claims the invention may be practiced otherwise than as specifically de scribed.

The entire disclosure of Japanese Patent Application No. 2013-243938, filed on Nov. 26, 2013 including specification, claims, drawings and summary, on which the Convention priority of the present application is based, is incorporated herein by reference in its entirety.

What is claimed is:

1. A semiconductor device comprising:
an n-type drift layer;
a p-type base layer in a channel region on the n-type drift layer;
an n-type emitter layer on the p-type base layer;
a trench-gate electrode penetrating the p-type base layer and the n-type emitter layer and being in contact with the p-type base layer and the n-type emitter layer through a gate insulating film;
a p-type anode layer in a region other than the channel region on the n-type drift layer;
an emitter electrode connected to the n-type emitter layer and the p-type anode layer;
a p-type collector layer below the n-type drift layer;
an n-type cathode layer below the n-type drift layer;
a collector electrode connected to the p-type collector layer and the n-type cathode layer;
an n-type buffer layer provided between the n-type drift layer and the p-type collector layer;
a p-type separation layer provided between the n-type drift layer and the n-type cathode layer; and
an embedded oxide film separating the p-type collector layer and the p-type separation layer from each other and separating the n-type cathode layer and the n-type buffer layer from each other.

2. The semiconductor device according to claim 1, wherein a width of the p-type collector layer is larger than a width of the n-type cathode layer.

3. The semiconductor device according to claim 1, further comprising an emitter connection resistor connected between the emitter electrode and the n-type emitter layer.

4. The semiconductor device according to claim 3, further comprising a first contact hole connecting the n-type emitter layer to the emitter electrode, and a second contact hole connecting the p-type base layer to the emitter electrode,
wherein the first contact hole and the second contact hole are separated from each other.

5. The semiconductor device according to claim 3, wherein surface concentration of the n-type emitter layer is lower than peak concentration of the n-type emitter layer.

6. The semiconductor device according to claim 1, wherein at least a part of the n-type cathode layer is arranged immediately below the p-type anode layer.

7. The semiconductor device according to claim 1, wherein one p-type anode layer is provided for the plurality of channel regions.

8. The semiconductor device according to claim 1, further comprising a p-type well layer in a terminal region and connected to the emitter electrode,
wherein the n-type cathode layer is not provided immediately below the p-type well layer.

9. The semiconductor device according to claim 1, further comprising a p-type well layer in a terminal region and connected to the emitter electrode, and an embedded oxide film provided between the n-type drift layer and the collector electrode immediately below the p-type well layer.

10. The semiconductor device according to claim 8, further comprising an emitter connection resistor connected between the emitter electrode and the p-type well layer.

* * * * *